United States Patent [19]
Kang et al.

[11] Patent Number: 6,083,068
[45] Date of Patent: Jul. 4, 2000

[54] FIELD EMISSION DEVICE AND METHOD OF FABRICATING THE SAME

[75] Inventors: Seok Ho Kang, Incheon-si; Kuk Jin Chun, Seoul, both of Rep. of Korea

[73] Assignee: LG Semicon Co., Ltd., Chungcheongbuk-do, Rep. of Korea

[21] Appl. No.: 09/003,182

[22] Filed: Jan. 5, 1998

[30] Foreign Application Priority Data

Apr. 28, 1997 [KR] Rep. of Korea .................. 97-15975

[51] Int. Cl.$^7$ ........................................... H01J 9/00
[52] U.S. Cl. ........................ 445/24; 445/50; 313/306
[58] Field of Search .................. 445/24, 50; 313/306, 313/309; 438/20

[56] References Cited

U.S. PATENT DOCUMENTS 5,898,258  4/1999  Sakai et al. .............................. 445/24

*Primary Examiner*—Vip Patel
*Assistant Examiner*—Todd Reed Hopper
*Attorney, Agent, or Firm*—Morgan, Lewis & Bockius LLP

[57] ABSTRACT

A field emission device includes a field emission cathode electrode having a cusp, a first insulating layer on the field emission cathode electrode excluding a portion over the cusp, a first electrode on the first insulating layer, a second insulating layer on the first electrode, a second electrode on the second insulating layer, a third insulating layer on the second electrode, and a silicon substrate on the third insulating layer. A method of fabricating a field emission device having a semiconductor substrate includes the steps of sequentially forming first and second insulating layers on first and second surfaces of the substrate, removing the first and the second insulating layers from the first surface of the substrate, forming a third insulating layer and a first metallic layer on the first surface of the substrate, selectively removing the first insulating layer and the second insulating layer on the second surface of the semiconductor substrate to expose the substrate, forming a fourth insulating layer and a second metallic layer on the first metallic layer, forming a hole trench to expose the third insulating layer, forming a fifth insulating layer over an exposed front surface including the hole trench, forming a third metallic layer on the fifth insulating layer, anisotropically etching the silicon substrate from the second surface to expose the fifth insulating layer through the hole trench, and removing the fifth insulating layer in the hole trench.

22 Claims, 8 Drawing Sheets

FIELD EMISSION DEVICE AND METHOD OF FABRICATING THE SAME

This application claims the benefit of Korean Application No. 15975/1997 filed on Apr. 28, 1997, which is hereby incorporated by reference.

BACKGROUND OF THE INVENTION

1. Field of the Invention

The present invention relates to a semiconductor device, and more particularly, to a field emission device and a method of fabricating the same. Although the present invention is suitable for a wide scope of applications, it is particularly suitable for forming a field emission device having a multistage electrode.

2. Discussion of the Related Art

A field emission is defined as electrons emitted by an electric field. The emission of electrons is caused by a quantum-mechanical tunnelling effect. The tunnelling occurs when a potential barrier becomes shallow while applying a high potential energy on the surface of a metal. Thus, electrons positioned at the Fermi level can directly pass through the potential barrier without overcoming the potential barrier.

FIGS. 1 and 2 schematically illustrate a conventional single electrode field emission device and a conventional micro-column electron beam lithography system, respectively.

There are two kinds of electron sources using the field emission: a single electrode field emission device comprising a tip 1 and a single gate electrode 2, as shown in FIG. 1; and a multistage electrode field emission device comprising a tip and a multistage electrode for effective focusing or acceleration of the emitted electrons.

In the single electrode field emission device, various fabricating methods for realizing both repeatability and reliability have been developed. Nonetheless, these devices have limitations in focusing and acceleration of the field emission.

Moreover, it is difficult to integrate at least two electrodes on one wafer in the multistage electrode field emission device. Accordingly, a conventional method of embodying the multistage electrode field emission device is to fabricate each of the chip and the multistage electrode separately and then assemble the two together. For example, as shown in FIG. 2, a previously manufactured field emission tip 4, which is manually aligned and assembled with multistage electrode 5, and lens group 6, for focusing the emitted field, are manually assembled to complete the device.

Therefore, in the conventional micro-column electron beam lithography system, because alignment and assemblies between tip and gate electrode or between electrodes are achieved by manual operation, the system is not capable of providing better characteristics in repeatability, uniformity and productivity. In addition, the system cannot achieve a complete symmetrical structure. As a result, a desirable optical characteristic is not produced properly. Although the micro-column array concept has been introduced to improve a major problem in the electron beam lithography system such as low productivity, uniformity and repeatability of the system have not improved and should not be ignored.

Therefore, research for performing an automatic alignment of the multistage electrode and the field emission tip and for integrating them on one wafer have been developed in order to solve the above-mentioned problems. One line of research has been focused on utilizing a straight line of flight deposition characteristic to align the multistage electrode automatically.

A conventional multistage electrode field emission device will now be described with reference to FIGS. 3A to 3F.

FIGS. 3A to 3F are cross-sectional views sequentially illustrating the process steps of fabricating a conventional multistage electrode field emission device.

As shown in FIG. 3A, a first silicon oxide layer ($SiO_2$) 12 and a first photoconductive layer 13 are sequentially deposited on a silicon substrate 11. After a tip portion is defined by exposure and developing process, the first silicon oxide layer 12 is selectively removed.

In FIG. 3B, the silicon substrate 11 is anisotropically-etched to have a predetermined depth by using a patterned first silicon oxide layer 12 as a mask. A thermal oxide layer 14 is formed by thermally oxidizing a surface of the etched silicon substrate 11. In this process, a portion of the silicon substrate 11 below the first silicon oxide layer 12 forms the thermal oxide layer 14 having a sharp point.

FIG. 3C shows a second silicon oxide layer (SiOx) 15 and a first metallic layer 16, for example, niobium (Nb), which are sequentially deposited on the first silicon substrate 12 and the silicon substrate 11. In this process, since the second silicon oxide layer 15 and the first metallic layer 16 are deposited by an evaporator having the straight line of flight deposition characteristic, the layers 15 and 16 are discontinuously deposited on both the first silicon oxide layer 12 and the silicon substrate 11 positioned at both sides of the first silicon oxide layer 12.

As shown in FIG. 3D, a second photoconductive layer 17 for defining a pad region is formed on the first metallic layer 16 positioned at one side of the first silicon oxide layer 12.

A third silicon oxide layer 18 and a second metallic layer 19, for example, niobium (Nb), are sequentially deposited on the second photoconductive layer 17 and the first metallic layer 16 as shown in FIG. 3E. In this process, the third silicon oxide layer 18 and the second metallic layer 19 are discontinuously deposited on the second photoconductive layer 17, the first metallic layer 16 on the first silicon oxide layer 12, and the first metallic layer 16 on the silicon substrate 11.

As shown in FIG. 3F, the second photoconductive layer 17 and the third silicon oxide layer 18 and the second metallic layer 19 on the second photoconductive layer 17 are removed. Also, the first silicon oxide layer 12 and the second silicon oxide layer 15, the first metallic layer 16, the third silicon oxide layer 18 and the second metallic layer 19 on the first silicon oxide layer 12 are selectively removed.

Then, an exposed portion of the thermal oxide layer 14 is selectively removed so that a sharp point of the silicon substrate 11 is exposed for fabricating the field emission device. The sharp point becomes an emitter of the field emission device.

However, this conventional art for fabricating the field emission device has the following problems.

In the conventional art, a silicon oxide layer and a metallic layer are formed by using a device having the straight line of flight deposition characteristic, so that the deposition of the layers is not uniform on all areas of the substrate. In other words, since the conventional art utilizes a point deposition source having the straight line of flight deposition characteristic, angles from the source to the wafer vary with distance from the center of the wafer. As a result, deposited layers tend to be a non-uniform structure.

Moreover, the silicon oxide layer fabricated by the conventional art is coarse and has poor crystallographic quality. In addition, since the silicon oxide layer has a high etching rate in an etching solution, such as a HF solution, the fabricating process becomes difficult and complicated.

Further, since a dielectric breakdown easily occurs, even in a low voltage in the conventional art, the range of voltages to be applied is a narrow limit.

SUMMARY OF THE INVENTION

Accordingly, the present invention is directed to a field emission device and a method of fabricating the same that substantially obviate one or more of the problems due to limitations and disadvantages of the related art.

An objective of the present invention is to provide a field emission device and a method of fabricating the same which enhance uniformity and productivity of the device.

To achieve these and other advantages and in accordance with the purpose of the present invention, as embodied and broadly described, a field emission device includes a field emission cathode electrode having a sharp cusp, a first insulating layer formed on the field emission cathode electrode excepting the cusp, a first electrode formed on the first insulating layer, a second insulating layer formed on the first electrode, and a second electrode formed on the second insulating layer.

In another aspect of the present invention, the field emission device includes a field emission cathode electrode having a cusp, a first insulating layer on the field emission cathode electrode excluding a portion over the cusp, a first electrode on the first insulating layer, a second insulating layer on the first electrode, a second electrode on the second insulating layer, a third insulating layer on the second electrode, and a silicon substrate on the third insulating layer.

In another aspect of the present invention, a method of fabricating a field emission device includes the steps of sequentially forming a first insulating layer and a second insulating layer on a front and back surfaces of a semiconductor substrate, removing the first insulating layer and the second insulating layer formed on the front surface of the semiconductor substrate, forming a third insulating layer and a first metallic layer on the front surface of the semiconductor substrate, selectively removing the first insulating layer and the second insulating layer formed on the back surface of the semiconductor substrate, forming a fourth insulating layer and a second metallic layer on the first metallic layer, forming a hole trench by selectively removing the first and second metallic layers and the fourth insulating layer, forming a fifth insulating layer to create a sharp cusp in the hole trench, forming a third metallic layer on the fifth insulating layer, anisotropic-etching the silicon substrate in order to expose the fifth insulating layer of the hole trench by using the first insulating layer and the second insulating layer as a mask, and removing the fifth insulating layer formed in the hole trench from a back surface of the silicon substrate.

In another aspect of the present invention, the method of fabricating a field emission device having a semiconductor substrate, includes the steps of sequentially forming first and second insulating layers on first and second surfaces of the substrate, removing the first and the second insulating layers from the first surface of the substrate, forming a third insulating layer and a first metallic layer on the first surface of the substrate, selectively removing the first insulating layer and the second insulating layer on the second surface of the semiconductor substrate to expose the substrate, forming a fourth insulating layer and a second metallic layer on the first metallic layer, forming a hole trench to expose the third insulating layer, forming a fifth insulating layer over an exposed front surface including the hole trench, forming a third metallic layer on the fifth insulating layer, anisotropically etching the silicon substrate from the second surface to expose the fifth insulating layer through the hole trench, and removing the fifth insulating layer in the hole trench.

In a further aspect of the present invention, the method of fabricating a field emission device having a semiconductor substrate includes the steps of sequentially forming first and second insulating layers on first and second surfaces of the substrate, removing the first and second insulating layers from the first surface of the substrate, forming a third insulating layer and a first metallic layer on the first surface of the substrate, selectively removing the first and second insulating layers from the second surface of the substrate, forming a fourth insulating layer and a second metallic layer on the first metallic layer, forming a hole trench by selectively removing the first and second metallic layers and the fourth insulating layer, forming, on an entire surface, a fifth insulating layer having a thickness that is thicker than a radius of the hole trench, performing an etch back for reaming the fifth insulating layer only in the hole trench, forming a sixth insulating layer to form a sharp cusp in the hole trench, forming a third metallic layer on the sixth insulating layer, anisotropically etching the substrate to expose the fifth insulating layer in the hole trench by using the first and second insulating layers as masks, and removing the sixth insulating layer in the hole trench from the second surface of the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
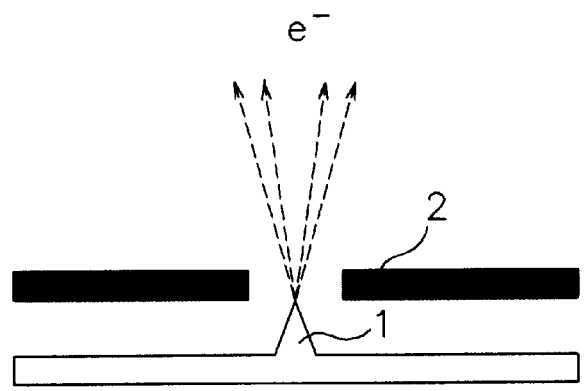
FIG. 1 is a schematic view of a conventional single electrode field emission device.
Figure 2:
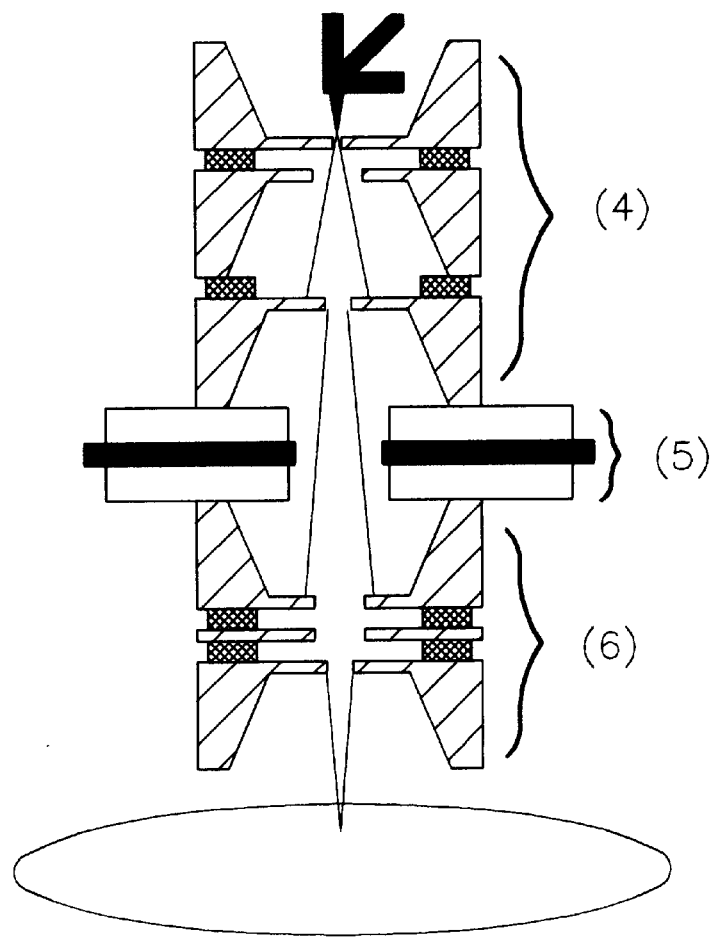
FIG. 2 is a schematic view of a conventional microcolumn electron beam lithography system.
Figure 3A:
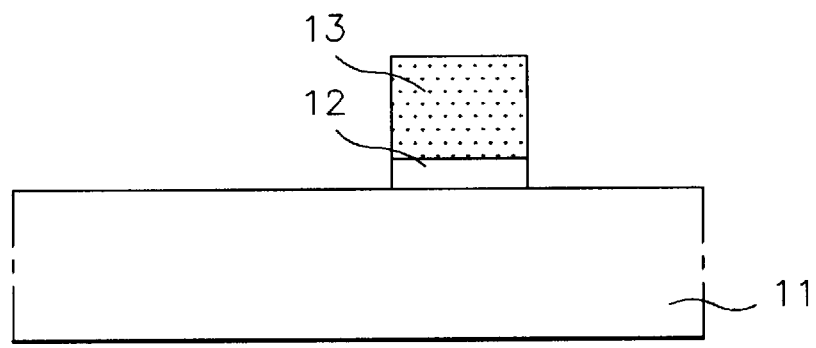
FIGS. 3A to 3F are cross-sectional views sequentially illustrating the process steps of fabricating a conventional multistage electrode field emission device.
Figure 3B:
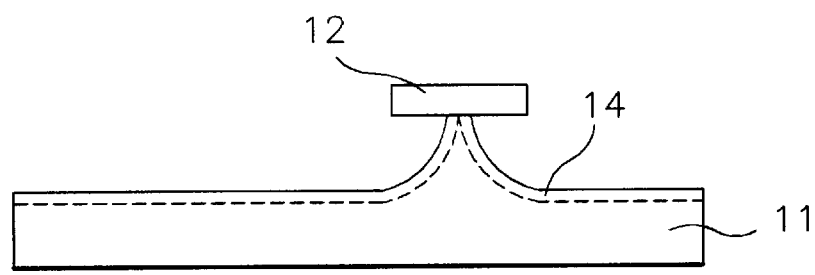
Figure 3C:
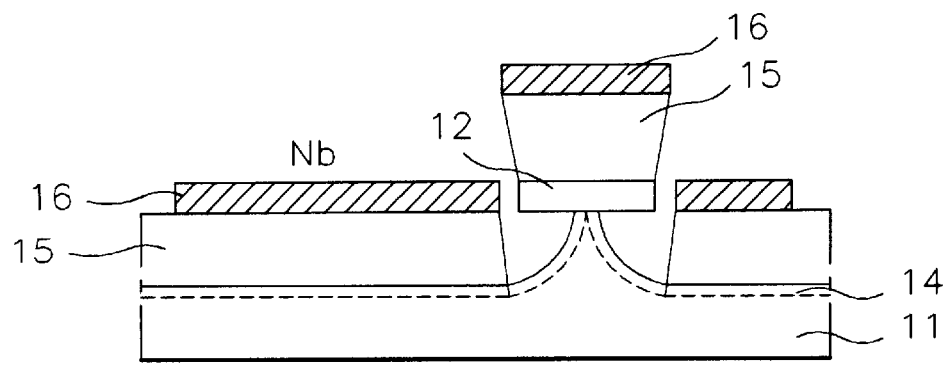
Figure 3D:
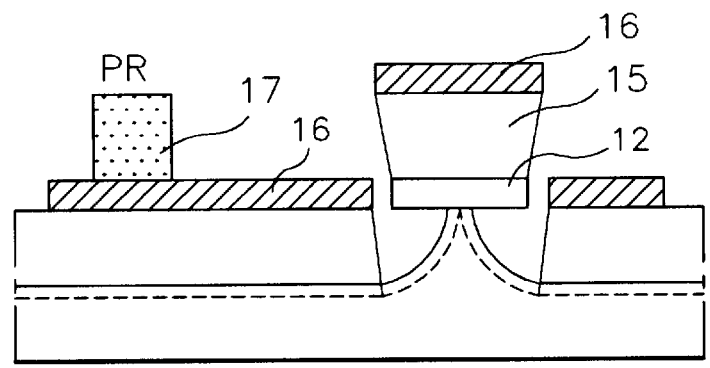
Figure 3E:
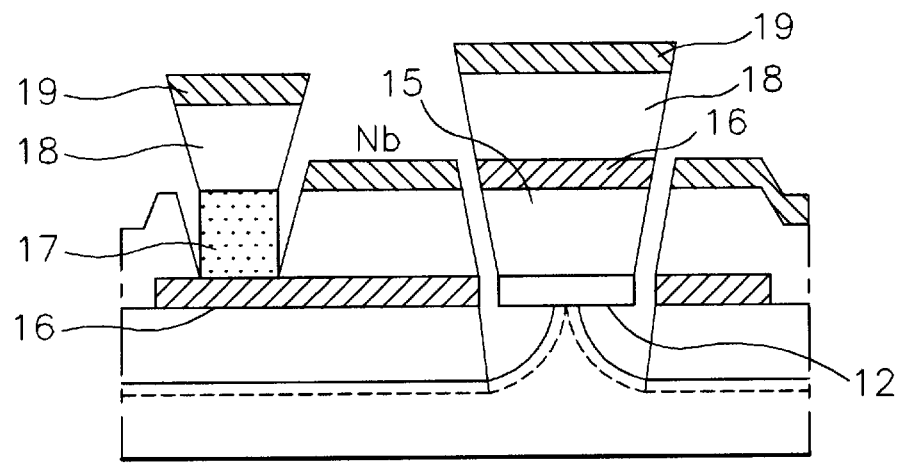
Figure 3F:
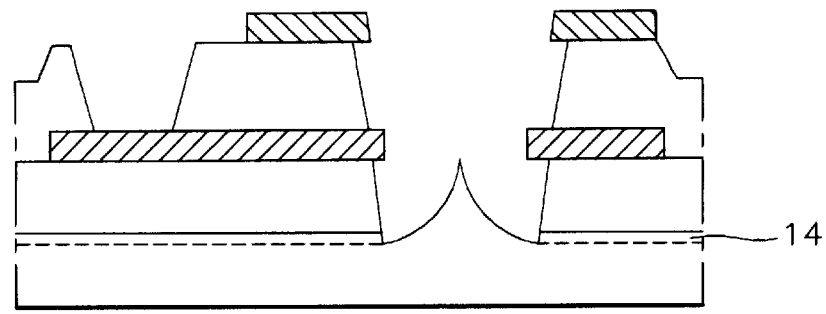
Figure 4:
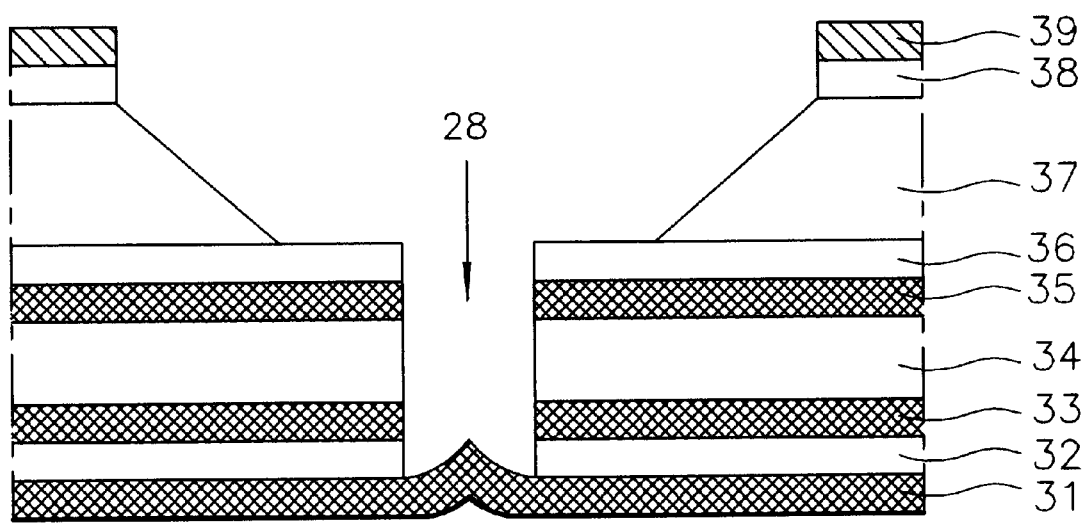
FIG. 4 is a cross-sectional view illustrating a multistage electrode field emission device in accordance with a preferred embodiment of the present invention.

In a structure of the field emission device according to the present invention, as shown in FIG. 4, a field emission cathode electrode 31 has a cusp, a first insulating layer 32 is on the field emission cathode electrode 31 excepting for a portion on the cusp, and a first electrode 33 is formed on the first insulating layer 32. A second insulating layer 34 is formed on the first electrode 33, and a second electrode 35 is formed on the second insulating layer 34.

Herein, reference numerals 36, 38 and 39 are the insulating layers, and reference numeral 37 is a silicon substrate. A hole trench 28 is formed over the portion of the cusp of the field emission cathode electrode 31. Accordingly, a path for emitting the electron from the cusp of the field emission cathode electrode 31 is formed thereon.

A method of fabricating the field emission device according to the present invention will now be described below.

Figure 5A:
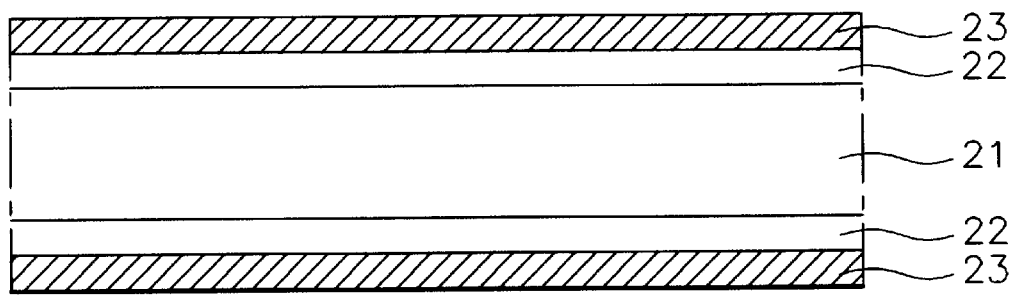
FIGS. 5A to 5G are cross-sectional views illustrating the process steps of fabricating a multistage electrode field emission device shown in FIG. 4.

As shown in FIG. 5A, a first insulating layer 22 and the second insulating layer 23 are sequentially formed on both front and back sides of the silicon substrate 21. In this process, a silicon oxide layer having 800~1200 Å is formed as the first insulating layer 22 by thermal oxidation. A silicon nitride layer having a thickness of 150~2500 Å is formed as the second insulating layer 23 by chemical vapor deposition (hereinafter referred to as a CVD).

The first insulating layer 22 and the second insulating layer 23 deposited in this process protect the silicon substrate 21 from being etched unnecessarily. Normally, using a silicon nitride layer as a mask layer is more desirable for this purpose. However, since the silicon nitride layer has a tensile stress, the silicon oxide layer, which has a compressive stress, is formed earlier by thermal oxidation in order to absorb the tensile stress of the silicon substrate 21.

Figure 5B:
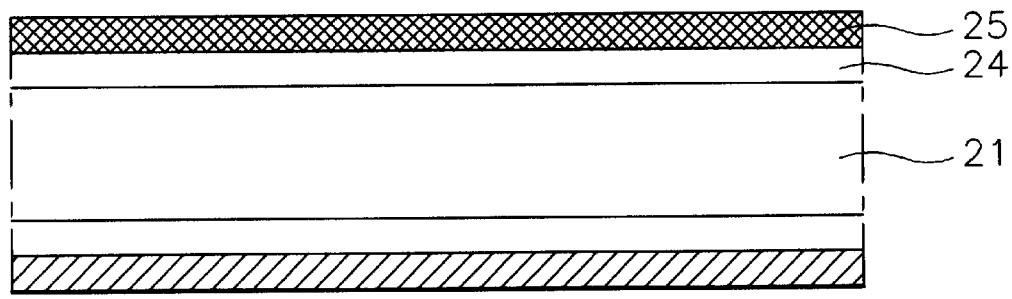

The thickness for the first insulating layer 22 and the second insulating layer 23 are necessary to protect the silicon substrate 21 from being etched unnecessarily, taking into consideration the etching rate of the silicon substrate 21. If a selectivity of the etching solution is considered, the thickness of 1500 Å is acceptable for the second insulating layer 23, but a thickness of 2000 Å is more desirable. As shown in FIG. 5B, the first insulating layer 22 and the second insulating layer 23 formed on the front surface of the silicon substrate 21 are removed by dry etching and wet etching, respectively.

The third insulating layer 24 and the first metallic layer 25 are sequentially deposited on the front surface where the first insulating layer 22 and the second insulating layer 23 are already removed. In this process, a silicon oxide layer having a thickness of 1200 Å to 1800 Å as the third insulating layer 24 is deposited on the silicon substrate 21 by plasma enhanced chemical vapor deposition (hereinafter referred to as PECVD). The first metallic layer 25 is deposited on the third insulating layer 24 using sputter by a thickness of 1200 Å to 1800 Å. A back surface align key (not shown) is formed by selectively removing the first metallic layer 25 through an etching process. The back surface align key is used to etch the silicon substrate 21 from the back surface and should be aligned with the front surface.

Herein, the third insulating layer 24 is used as an etch stopper in etching the silicon substrate 21. A thickness for the third insulation layer 24 depends upon an etching solution, and the third insulating layer having the aforementioned thickness, for example, is appropriate for an EDS solution.

The first metallic layer 25 is used as a secondary electrode and includes metals such as $LaB_6$, Nb, Mo, Ta, and W. However, since the field emission device uses a tunnelling phenomenon, a material having a low work function is more desirable. On the other hand, the process should be executed under a high vacuum condition to suppress the reactive material around the surface. A low work function material has a highly reactive surface.

Although $LaB_6$ has the highest work function among the above metals, it is difficult to maintain the vacuum condition with this metal. Molybdenum (MO) is the most desirable for the field emission device although it has the work function lower than $LaB_6$. Specifically, it is fireproof and has high electric mobility. Moreover, Mo has reasonable electron mobility even at relatively low temperature (about 300° C.).

When Mo is chosen as the first metallic layer 25, an etching process for forming an align key is executed in a solution having a normal temperature and compositions of $H_3PO_4$: $HNO_3$: $CH_3COOH$: D.I. water=80:5:10, and an etching rate is about 400 to 600 Å/min.

Figure 5C:
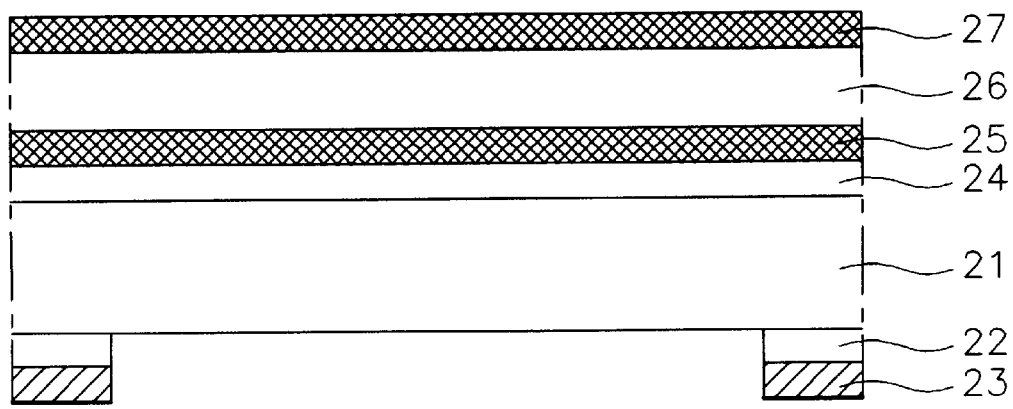

As shown in FIG. 5C, by using photolithography, the first insulating layer 22 and the second insulating layer 23 formed on the back surface of the silicon substrate 21 are selectively removed from the silicon substrate 21 in a later process.

In this process, it is important to align the back surface of the silicon substrate 21 with the front surface thereof. Thus, a pattern is defined by aligning both sides of the surfaces using a double-side aligner. The alignment key formed on the first metallic layer 25 is also used to align the front and back surfaces. Herein, the double-side aligner uses a characteristic of the infra-red that cannot penetrate metal layers.

As described above, after the first insulating layer 22 and the second insulating layer 23 are selectively removed, the fourth insulating layer 26 and the second metallic layer 27 are sequentially deposited on the first metallic layer 25, as shown in FIG. 5C. As the fourth insulating layer 26, a silicon coral layer (not shown) is deposited to have a thickness of 5000 Å to 7000 Å. Mo as the second metallic layer is deposited to have a thickness of 1200 Å to 1800 Å.

The fourth insulating layer 26 is formed to have enough thickness to prevent a dielectric breakdown caused by an applied voltage difference between a primary electrode and a secondary electrode. A breakdown voltage of a PECVD silicon oxide layer is about 8 MV/cm. Thus, when the applied voltage difference between the primary electrode and secondary electrode to focus the emitted electron is about 100 V, a desirable thickness of the fourth insulating layer 26 is about 1250 Å. If the voltage applied to both the primary electrode and the secondary electrode is 400 V for accelerating the emitted electron, about 5000 Å is appropriate for the thickness of the fourth insulating layer 26. Further, a proper thickness of the fourth insulating layer 26 is about 6000 Å if 20% of exceeding voltage difference is considered. The silicon oxide layer is deposited with a deposition rate of about 120 Å/sec under conditions of 9.0 Torr, RF Power 350 Watt, TEOS 220 sccm, He 220 sccm, and $O_2$ 220 sccm.

Figure 5D:
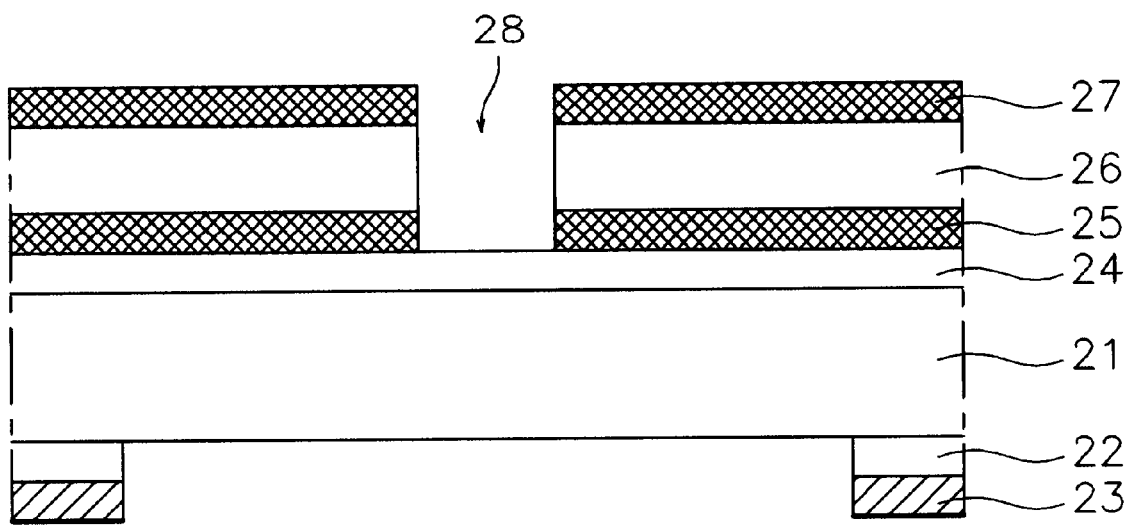

As shown in FIG. 5D, the first and second metallic layers 25 and 27 and the fourth insulating layer 26 are selectively removed by electron beam lithography, thereby forming a hole trench 28 over the third insulating layer 24. At this time, the electron beam is used to produce a hole trench having a small diameter, and the hole trench 28 is positioned at the center portion of the first insulating layer 22 and the second insulating layer 23 removed from the back side.

Figure 5E:
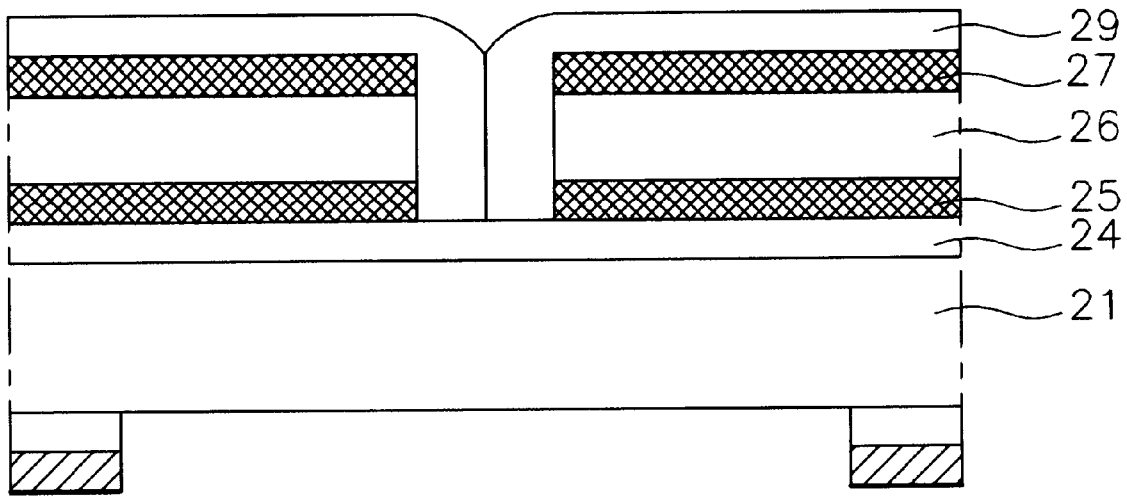

As shown in FIG. 5E, a fifth insulating layer 29 is deposited on the entire surface using a PECVD method. In this process, when the fifth insulating layer 29 is made of a silicon oxide layer processed by an ideal conformal deposition, a thickness of the silicon oxide layer is about half the diameter of the hole trench 28. Thus, a mold for a cusp shape is formed in the hole trench 28.

If an aspect ratio is too high due to a non-conformal deposition of the silicon oxide layer for the fifth insulating layer 29, the thickness of the silicon oxide layer should be larger than half the diameter of the hole trench 28.

Figure 5F:
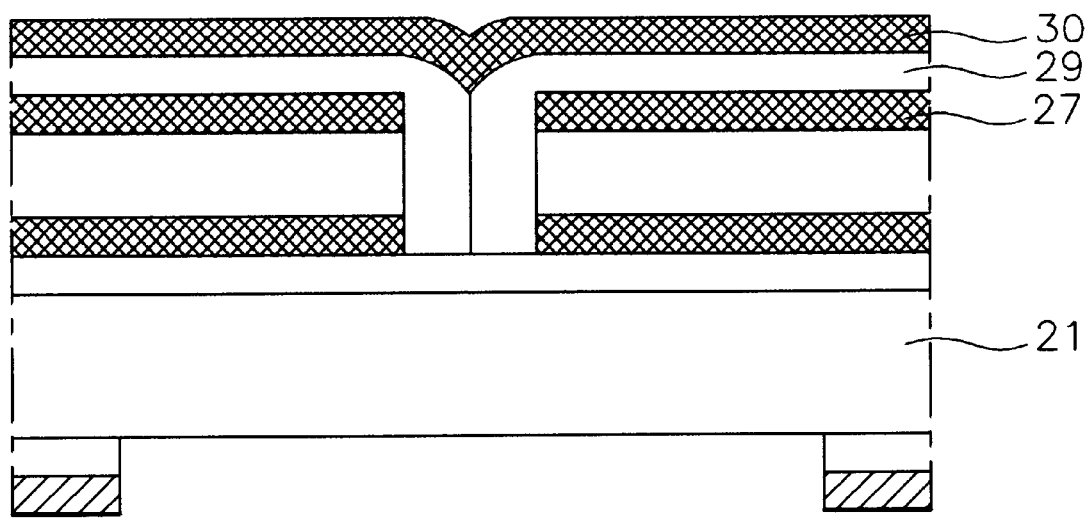
Figure 5G:
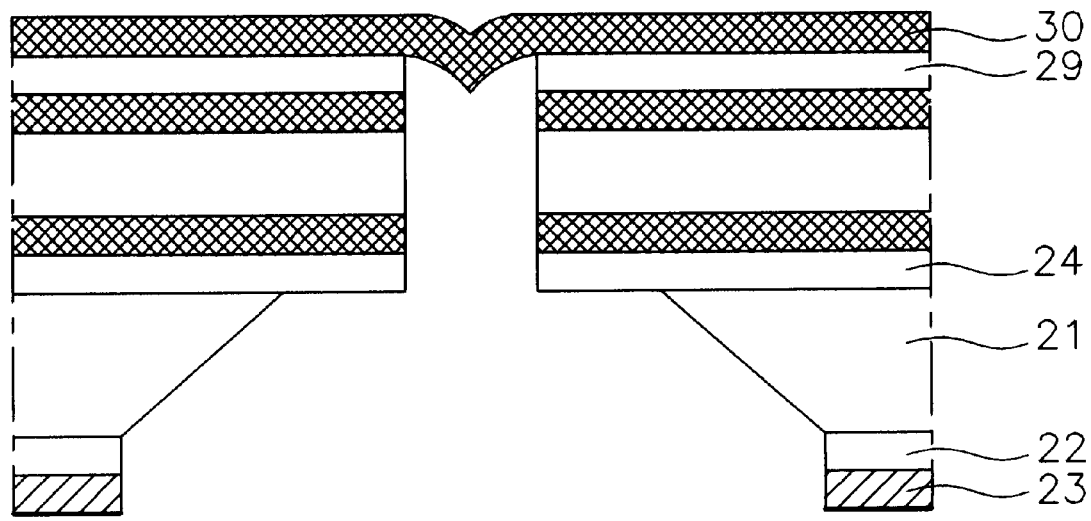

As shown in FIG. 5F, a third metal layer 30 for a cathode electrode of the field emission device is deposited on the fifth insulating layer 29. Subsequently, using the first insulating layer 22 and the second insulating layer 23 on the back side as masks, and the third insulating layer 24 as an etch stop layer, the back side of the silicon substrate 21 is anisotropically etched.

Generally, Potassium Hydroxide (KOH) solution or Ethylene Diamine Pyrocatechol and water (EDP) solution are used as an etching solution for anisotropic etching. Although the etching rate of a [100] direction with respect to a [111] direction of the silicon is larger in the KOH solution, the EDP solution is more promising in both etch selectivity against the oxide and nitride layers and etch stop characteristic in the oxide layer. However, because the EDP solution includes a large amount of carbon, white residue may remain on the device after an etching process. Since the white residue can not be removed easily, the patterning process may not be performed accurately.

Accordingly, in order to reduce a formation of the white residue in a back-side silicon bulk etching, a thickness of about 450 μm are etched by the KOH solution which provides a good anisotropic characteristic, a better etching rate, and no reside problem. The remaining thickness of about 70 μm is etched by the EDP solution for a better etch stop.

The KOH solution is used for etching the silicon substrate 21 under conditions of, for example, 40 wt. % and 80° C. Additionally, a jig specially manufactured to protect the front of wafer is used in this process. On the other hand, the EDP solution has conditions of, for example, Ethylenediamine 400 ml, Pyrocatechol 64 g, deionized water (D.I. water) 128 g, Pyrazine 3 g, and 115° C. An additional jig is not used for etching by the EDP solution.

The fifth insulating layer 29 formed in the hole trench 28 is exposed after the silicon substrate 21 is etched from the back side. Accordingly, the fifth insulating layer 29 formed in the hole trench 28 is removed from the back side of the silicon substrate 21.

As described above, the method of fabricating the field emission device in accordance with a preferred embodiment of the present invention includes the further steps of depositing the fourth insulating layer 26 and the second metallic layer 27, so that electrodes for focusing and accelerating electrons may be fabricated additionally.

Alternatively, when the aspect ratio is larger because of non-conformal deposition of the fifth insulating layer 29 as shown in FIG. 5E, another embodiment of fabricating method may be used as follows.

Figure 6A:
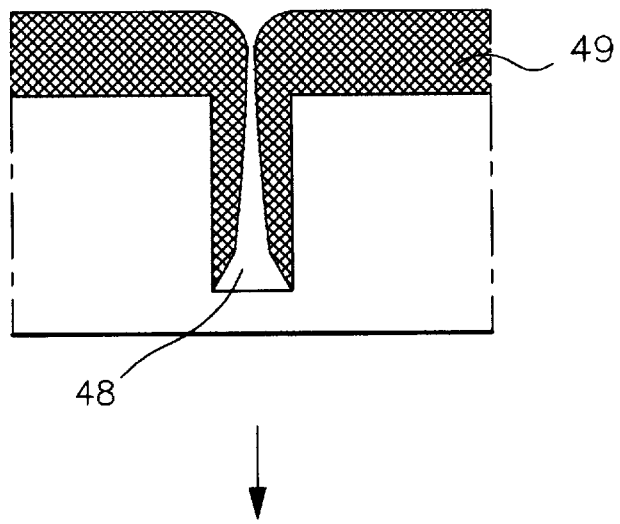
FIGS. 6A to 6C are cross-sectional views sequentially illustrating the process steps of fabricating a field emission device in accordance with another preferred embodiment of the present invention.
Figure 6B:
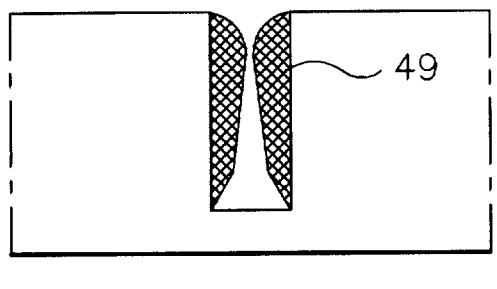
Figure 6C:
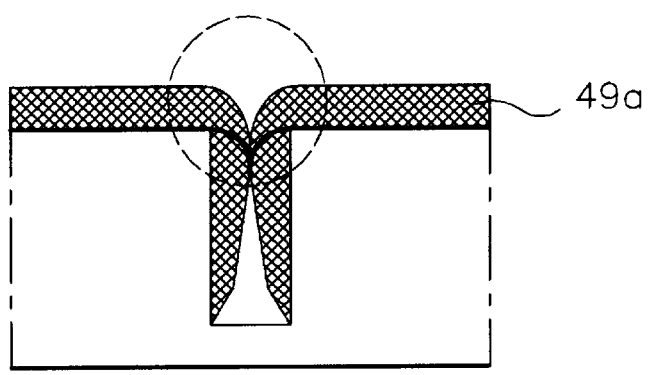

FIGS. 6A to 6C are cross-sectional views sequentially illustrating the process steps of fabricating a field emission device in accordance with another embodiment of the present invention.

As shown in FIG. 6A, a fifth insulating layer 49, for example, silicon oxide layer, having a thickness greater than a radius of the hole trench 48 is formed on the entire surface of the substrate having a hole trench 48.

Subsequently, as shown in FIG. 6B, an etch back process is executed to remove the fifth insulating layer 49 outside the hole trench 48, so that the fifth insulating layer is remaining only in the hole trench 48. Herein, the fifth insulating layer 49 is etched by the etch back process to reduce a distance between a tip and a primary electrode. The distance between the tip and the primary electrode becomes large when the cusp is directly formed in the hole trench without performing the etch back process. Therefore, operating voltage becomes high when the distance is large.

In FIG. 6C, a sixth insulating layer 49a, for example, silicon oxide layer is deposited in the hole trench 48 to have a cusp. Accordingly, the field emission device is completed through the aforementioned processes.

The method of fabricating the field emission device according to the present invention has the following effects.

Since an insulating layer and a metallic layer are formed without using equipment having a characteristic of straight line of flight deposition, a uniform deposition is obtained on the entire area of the substrate, thereby providing uniformity and excellent repeatability in fabricating the device.

Moreover, a tip, a primary electrode, and a secondary electrode are formed on a single wafer by using an alignment light exposing device, so that repeatability and productivity are greatly enhanced.

Further, the size of the field emission device is greatly reduced by using a semiconductor manufacturing process. As a result, the present invention is applicable even where an array of the electron source is required, and each electron source is separately controlled by simple layout design.

It will be apparent to those skilled in the art that various modifications and variations can be made in a field emission device of a multistage electrode and a method of fabricating the same of the present invention without departing from the spirit or scope of the invention. Thus, it is intended that the present invention cover the modifications and variations of this invention provided they come within the scope of the appended claims and their equivalents.

What is claimed is:

1. A method of fabricating a field emission device having a semiconductor substrate, comprising the steps of:

sequentially forming first and second insulating layers on first and second surfaces of the substrate;

removing the first and the second insulating layers from the first surface of the substrate;

forming a third insulating layer and a first metallic layer on the first surface of the substrate;

selectively removing the first insulating layer and the second insulating layer on the second surface of the semiconductor substrate to expose the substrate;

forming a fourth insulating layer and a second metallic layer on the first metallic layer;

forming a hole trench to expose the third insulating layer;

forming a fifth insulating layer over the first surface of the substrate including the hole trench;

forming a third metallic layer on the fifth insulating layer;

anisotropically etching the silicon substrate from the second surface to expose the fifth insulating layer through the hole trench; and removing the fifth insulating layer in the hole trench.

2. The method according to claim 1, further comprising the step of:

selectively removing the first metallic layer positioned at a peripheral portion to form an align key after the step of forming the third insulating layer and the first metallic layer.

3. The method according to claim 2, wherein the first metallic layer includes molybdenum (Mo).

4. The method according to claim 2, wherein the align key is formed by etching the first metallic layer in an etching solution having compositions of $H_3PO_4:HNO_3:CH_3COOH:D.I.$ water=80:5:5:10.

5. The method according to claim 4, wherein the step of removing the first metallic layer is executed to have an etching rate of 400 to 600 Å/min.

6. The method according to claim 2, wherein the step of selectively removing the first insulating layer and the second insulating layer is executed by a double-side aligner using an align key.

7. The method according to claim 1, wherein the first insulating layer includes an oxide layer having a thickness of 800 Å to 1200 Å.

8. The method according to claim 7, wherein the oxide layer is formed by thermal oxidation.

9. The method according to claim 1, wherein the second insulating layer includes a nitride layer having a thickness of 1500 Å to 2500 Å.

10. The method according to claim 9, wherein the nitride layer is formed by chemical vapor deposition (CVD).

11. The method according to claim 1, wherein the step of removing the first and second insulating layers is executed by wet etching and dry etching, respectively.

12. The method according to claim 1, wherein the third insulating layer includes an oxide layer having a thickness of 1200 Å to 1800 Å.

13. The method according to claim 12, wherein the oxide layer is formed by plasma enhanced chemical vapor deposition (PECVD).

14. The method according to claim 1, wherein the first metallic layer and the second metallic layer include molybdenum (MO) having a thickness of 1200 Å to 1800 Å.

15. The method according to claim 1, wherein the fourth insulating layer includes an oxide layer having a thickness of 5000 Å to 7000 Å.

16. The method according to claim 1, wherein the fifth insulating layer includes an oxide layer having a thickness of half a diameter of the hole trench.

17. The method according to claim 1, wherein the step of anisotropically etching silicon substrate is executed in Potassium Hydroxide (KOH) solution and Ethylene Diamine Pyrocatechal and water (EDP) solution.

18. The method according to claim 17, wherein the KOH solution has a concentration of 40 wt. % and a temperature of 80° C.

19. The method according to claim 17, wherein the KOH solution is used with a jig for protecting the first surface of the substrate.

20. The method according to claim 12, wherein the EDP solution has compositions of ethylenediamine 400 ml, Pyrocatechol 64 g, deionized water 128 g, and pyrazine 3 g, and a temperature of 115° C.

21. The method according to claim 1, further comprising the step of forming electrodes for focusing and accelerating electrons by depositing the fourth insulating layer and the second metallic layer on the third metallic layer.

22. A method of fabricating a field emission device having a semiconductor substrate, comprising the steps of:

sequentially forming first and second insulating layers on first and second surfaces of the substrate;

removing the first and second insulating layers from the first surface of the substrate;

forming a third insulating layer and a first metallic layer on the first surface of the substrate;

selectively removing the first and second insulating layers from the second surface of the substrate;

forming a fourth insulating layer and a second metallic layer on the first metallic layer;

forming a hole trench by selectively removing the first and second metallic layers and the fourth insulating layer;

forming a fifth insulating layer having a thickness larger than a radius of the hole trench on an entire surface;

executing an etch back process to leave the fifth insulating layer only in the hole trench;

forming a sixth insulating layer to form a cusp in the hole trench;

forming a third metallic layer on the sixth insulating layer;

anisotropically etching the substrate to expose the fifth insulating layer in the hole trench by using the first and second insulating layers as masks; and removing the sixth insulating layer in the hole trench from the second surface of the substrate.

* * * * *